(12) United States Patent
Zhu

(10) Patent No.: US 8,076,734 B2
(45) Date of Patent: Dec. 13, 2011

(54) SEMICONDUCTOR STRUCTURE INCLUDING SELF-ALIGNED DEPOSITED GATE DIELECTRIC

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 11/946,942

(22) Filed: Nov. 29, 2007

(65) Prior Publication Data

US 2009/0140345 A1 Jun. 4, 2009

(51) Int. Cl.
*H01L 27/00* (2006.01)
*H01L 21/8238* (2006.01)

(52) U.S. Cl. . 257/401; 257/204; 257/369; 257/E27.046; 257/E21.632; 257/E27.108

(58) Field of Classification Search .................. 257/369, 257/350, 351, 374
See application file for complete search history.

(56) References Cited

U.S. PATENT DOCUMENTS

| | | | |
|---|---|---|---|
| 5,716,865 A * | 2/1998 | Ahn .............................. | 438/264 |
| 6,653,698 B2 | 11/2003 | Lee et al. | |
| 6,700,163 B2 * | 3/2004 | Breitwisch et al. ........... | 257/369 |
| 6,727,127 B1 * | 4/2004 | Darmawan et al. ........... | 438/197 |
| 6,794,234 B2 | 9/2004 | Polishchuk et al. | |
| 7,790,541 B2 * | 9/2010 | Doris et al. ................... | 438/199 |
| 2002/0064970 A1 * | 5/2002 | Chooi et al. .................. | 438/785 |
| 2007/0138563 A1 * | 6/2007 | Callegari et al. ............. | 257/369 |
| 2009/0152640 A1 * | 6/2009 | Hase ............................. | 257/369 |

OTHER PUBLICATIONS

Park et al., in "Thermally Robust Dual-Work Function ALD-MNx MOSFET Using Conventional CMOS Process Flow," VLSI 2004.
Chen et al., in "Achieving area-selective atomic layer deposition on patterned substrates by selective surface modification," Applied Physics Letters, 86, 191910-1 (2005).

* cited by examiner

*Primary Examiner* — Kenneth Parker
*Assistant Examiner* — David Spalla
(74) *Attorney, Agent, or Firm* — Scully, Scott, Murphy & Presser, P.C.; H. Daniel Schnurmann

(57) ABSTRACT

A semiconductor structure, such as a field effect device structure, and more particularly a CMOS structure, includes a gate dielectric that is at least in-part aligned to an active region of a semiconductor substrate over which is located the gate dielectric. The gate dielectric comprises other than a thermal processing product of the semiconductor substrate. In particular, the gate dielectric may be formed using an area selective deposition method such as but not limited to an area selective atomic layer deposition method. Within the context of a CMOS structure, the invention provides particular advantage insofar as the use of a self-aligned method for forming a gate dielectric aligned upon an active region of a semiconductor substrate may avoid a masking process that may otherwise be needed to strip portions of an area non-selective blanket gate dielectric.

17 Claims, 5 Drawing Sheets

US 8,076,734 B2

SEMICONDUCTOR STRUCTURE INCLUDING SELF-ALIGNED DEPOSITED GATE DIELECTRIC

BACKGROUND

1. Field of the Invention

The invention relates generally to semiconductor structures. More particularly, the invention relates to semiconductor structures with enhanced manufacturability.

2. Description of the Related Art

Semiconductor structures typically include semiconductor devices that are located and formed within and upon a semiconductor substrate. A particularly common semiconductor structure is a complementary metal oxide semiconductor (CMOS) structure. A CMOS structure comprises a complementary doped pair of field effect devices, such as field effect transistor devices, located and formed within a single semiconductor substrate. The single semiconductor substrate may comprise a single crystallographic orientation region or multiple crystallographic orientation regions.

CMOS structures are desirable within the semiconductor fabrication art insofar as CMOS devices typically consume less power than semiconductor devices that comprise other than CMOS devices. In addition, CMOS structures have desirably been successfully scaled in dimension over the period of several decades to provide the particularly common, and highly useful, CMOS structure.

Among other avenues for CMOS device performance enhancement, recent advances in CMOS structure and CMOS device fabrication have included the use of separate gate materials for the fabrication of an nFET gate in comparison with a pFET gate in a CMOS structure. The use of such separate gate materials for fabrication of an nFET gate and a pFET gate in a CMOS structure allows for tuning of a particular work function of a particular nFET gate or pFET gate, which in turn allows for optimization of performance of an individual nFET device or pFET device in a particular CMOS structure. While the use of such separate gate materials for nFET gate and pFET gate fabrication within CMOS structures is thus desirable within the context of CMOS structure and CMOS device fabrication, the use of such separate gate materials for nFET gate and pFET gate fabrication in CMOS structures and CMOS devices is not entirely without problems. In that regard, the use of separate gate materials within nFET gates and pFET gates in CMOS structures and CMOS devices often provides manufacturing complexity.

Various CMOS structures and CMOS devices are known in the semiconductor fabrication art.

For example, Lee et al., in U.S. Pat. No. 6,653,698, teaches a dual work function CMOS structure. This particular dual work function CMOS structure includes a first gate that comprises a laminate of a first metal and a second metal upon the first metal, and a second gate that comprises a laminate of a third metal and the second metal upon the third metal.

In addition, Polishchuk, in U.S. Pat. No. 6,794,234, also teaches a dual work function CMOS structure. This particular dual work function CMOS structure comprises a first gate that comprises a first metal, and a second gate that comprises a second metal and an alloy of the first metal and a second metal located upon the second metal.

Finally, Park et al., in "Thermally Robust Dual-Work Function ALD-MNx MOSFET Using Conventional CMOS Process Flow," VLSI 2004 teaches a dual work function CMOS structure that may be fabricated using conventional CMOS processing. This particular dual work function CMOS structure uses polysilicon/metal nitride gates.

Novel semiconductor structures and semiconductor devices, including in particular CMOS structures and CMOS devices, are certain to continue to be prevalent as semiconductor technology advances. Thus, desirable are semiconductor structures and semiconductor devices, such as CMOS structures and CMOS devices, with enhanced performance and enhanced manufacturability.

SUMMARY OF THE INVENTION

The invention includes a semiconductor structure and a method for fabricating the semiconductor structure. The semiconductor structure includes a gate dielectric of composition other than a thermal processing product of a semiconductor substrate which comprises the semiconductor structure. The gate dielectric is located at least in-part aligned to an active region that is surrounded by an isolation region within the semiconductor substrate which comprises the semiconductor structure. The gate dielectric is formed using an area selective deposition method, such as but not limited to an area selective atomic layer deposition method, that provides the gate dielectric of composition other than the thermal processing product of the semiconductor substrate located at least in-part aligned (i.e., and formed self-aligned) to the active region that is surrounded by the isolation region within the semiconductor substrate.

More particularly, the inventive semiconductor structure may comprise a CMOS structure where at least one type of gate dielectric (i.e., either an nFET gate dielectric or a pFET gate dielectric) is located at least in-part aligned to an active region that is surrounded by an isolation region within a semiconductor substrate. Within the context of a particular processing sequence that is illustrated in further detail below, the use of an area selective deposition method for forming a gate dielectric that is originally self-aligned to an active region within such a CMOS structure may allow for avoidance of a masking step that would otherwise be needed for removing unneeded portions of a blanket gate dielectric within the CMOS structure.

As an example, and without intention of limiting the invention, the "gate dielectric of composition other than a thermal processing product of the semiconductor substrate" would be other than a silicon oxide gate dielectric, a silicon nitride gate dielectric or a silicon oxynitride gate dielectric when a semiconductor substrate upon which is formed the gate dielectric comprises a silicon semiconductor material.

A particular semiconductor structure in accordance with the invention includes a semiconductor substrate including an isolation region that surrounds an active region; a gate dielectric comprising other than a thermal processing product of the semiconductor substrate located on a surface of the active region of the semiconductor substrate; a gate electrode located on a surface of the gate dielectric; and a pair of source and drain regions located within the active region and separated by a channel region located beneath the gate electrode, wherein the gate dielectric has a first set of edges in a first direction and a second set of edges in a second direction that intersects the first direction, wherein the first set of edges in the first direction is aligned to, and does not extend beyond, outer edges of the gate electrode, and the second set of edges in the second direction has a first edge that coincides with, and is aligned to, and does not extend beyond, a first edge of the isolation region in a view in a direction perpendicular to the surface of the active region and a second edge that extends beyond a second edge of the isolation region.

Another particular CMOS semiconductor structure in accordance with the invention includes a semiconductor substrate including a plurality of active regions surrounded by an isolation region; a plurality of gate dielectrics located upon the plurality of active regions, at least one of the plurality of gate dielectrics comprising other than a thermal processing product of the semiconductor substrate; a plurality of gate electrodes located over the plurality of gate dielectrics; and a plurality of source and drain regions located within the plurality of active regions and separated by a plurality of channel regions located beneath the plurality of gate electrodes, wherein at least one of the plurality of gate dielectrics has a first set of edges in a first direction and a second set of edges in a second direction that intersects the first direction, the first set of edges in the first direction is aligned to, and does not extend beyond, outer edges of at least one of the plurality of gate electrodes, and the second set of edges in the second direction has a first edge that coincides with, and is aligned to, and does not extend beyond, a first edge of the isolation region in a view in a direction perpendicular to the surface of the active region and a second edge that extends beyond a second edge of the isolation region.

A particular method for fabricating a semiconductor structure in accordance with the invention includes forming upon a first active region of a semiconductor substrate a first gate dielectric. This particular method also includes forming selectively upon a second active region of the semiconductor substrate but not upon an isolation region that surrounds the second active region of the semiconductor substrate a second gate dielectric comprising other than a thermal processing product of the semiconductor substrate. This particular method also includes forming over the first gate dielectric a first gate electrode and forming over the second gate dielectric a second gate electrode. This particular method also includes forming into the semiconductor substrate and separated by each of the first gate electrode and the second gate electrode a plurality of source and drain regions.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a semiconductor structure having particular gate dielectric structural properties, and a method for fabricating the semiconductor structure having the particular gate dielectric structural properties, is understood within the context of the description set forth below. The description set forth below is understood within the context of the drawings described above. Since the drawings are intended for illustrative purposes, the drawings are not necessarily drawn to scale.

FIG. 1 to FIG. 9 show a series of schematic cross-sectional and plan-view diagrams illustrating the results of progressive stages in fabricating a CMOS structure in accordance with a particular embodiment of the invention that comprises a sole preferred embodiment of the invention.

Figure 1:
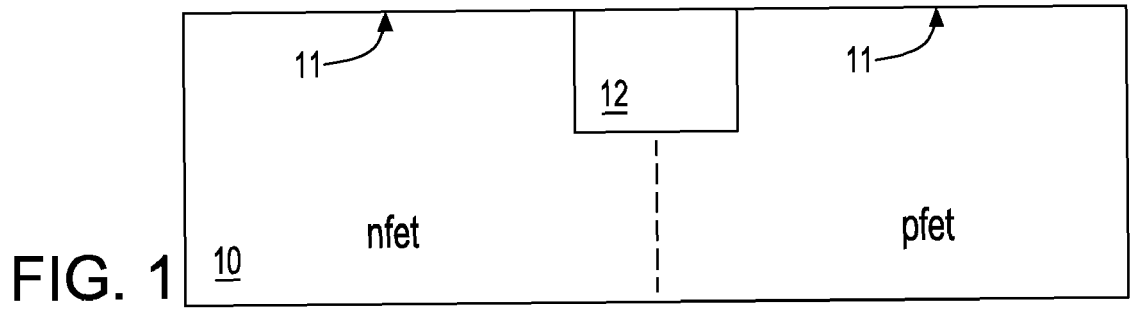
FIG. 1 to FIG. 9 show a series of schematic cross-sectional and plan-view diagrams illustrating the results of progressive stages in fabricating a CMOS structure in accordance with a particular embodiment of the invention.

FIG. 1 shows a schematic cross-sectional diagram of the CMOS structure at an early stage in the fabrication thereof in accordance with this particular preferred embodiment of the invention that comprises a sole preferred embodiment of the invention.

FIG. 1 shows a semiconductor substrate 10. An isolation region 12 is located within the semiconductor substrate 10. The isolation region 12 separates a plurality of active regions 11 within the semiconductor substrate 10. As is illustrated within the context of the phantom line that is illustrated in FIG. 1, the semiconductor substrate 10 is intended for fabrication of a CMOS device due to inclusion of an appropriately doped nFET region on the left hand side of the semiconductor substrate 10 and an appropriately doped pFET region on the right hand side of the semiconductor substrate 10.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., II-V and II-VI) semiconductor materials. Non-limiting examples of compound semiconductor materials include gallium arsenide, indium arsenide and indium phosphide semiconductor materials. Typically, the semiconductor substrate 10 has a thickness from about 1 to about 3 millimeters.

The isolation region 12 may comprise any of several dielectric isolation materials. Non-limiting examples include oxides, nitrides and oxynitrides, particularly of silicon, but oxides, nitrides and oxynitrides of other elements are not excluded. The isolation region 12 may comprise a crystalline or a non-crystalline dielectric isolation material, with crystalline dielectric isolation materials being highly preferred. The isolation region 12 may be formed using any of several methods. Non-limiting examples include ion implantation methods, thermal or plasma oxidation or nitridation methods, chemical vapor deposition methods and physical vapor deposition methods. Typically, the isolation region 12 comprises at least in-part an oxide of the semiconductor material from which is comprised the semiconductor substrate 10. Typically, the isolation region 12 has a linewidth within the semiconductor substrate 10 from about 100 to about 500 nanometers and a depth within the semiconductor substrate from about 100 to about 1000 nanometers.

Although this particular embodiment illustrates the invention within the context of a semiconductor substrate 10 that is illustrated within the context of a bulk semiconductor substrate, neither the embodiment, nor the invention, is intended to be so limited. Rather, both the embodiment and the invention may alternatively be practiced using a semiconductor-on-insulator (SOI) substrate that would result from inclusion of a buried dielectric layer interposed between a base semiconductor substrate portion of the semiconductor substrate 10 and a surface semiconductor layer portion of the semiconductor substrate 10.

This particular embodiment also contemplates use of a hybrid orientation (HOT) substrate that includes multiple crystallographic orientation regions that are supported upon a single semiconductor substrate.

Within the context of these alternative semiconductor substrates that may be used in place of the semiconductor substrate 10 that is illustrated in FIG. 1, such a semiconductor-on-insulator substrate or a hybrid orientation substrate may be fabricated using any of several methods that are otherwise also generally conventional in the semiconductor fabrication art. Included in particular as non-limiting examples are layer lamination methods, layer transfer methods and separation by implantation of oxygen (SIMOX) methods.

Figure 2:
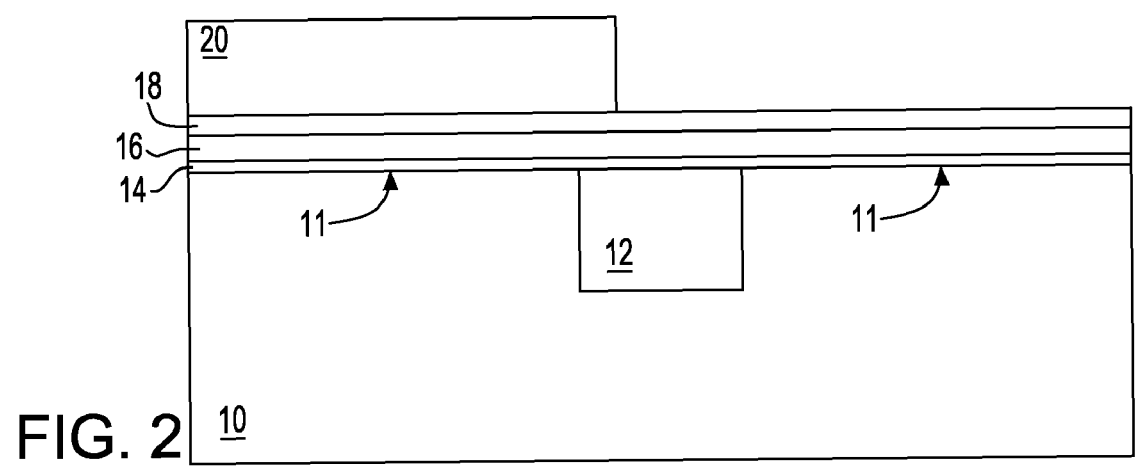

FIG. 2 shows a first gate dielectric 14 located upon the semiconductor structure of FIG. 1, including in particular the active regions 11 of the semiconductor substrate 10 and the isolation region 12. FIG. 2 also shows a first gate material layer 16 located and formed upon the first gate dielectric 14. FIG. 2 also shows a capping layer 18 located and formed upon the first gate material layer 16. FIG. 2 further shows a photoresist layer 20 located upon the capping layer 18 and covering a left hand portion of the semiconductor structure whose schematic cross-sectional diagram is illustrated in FIG. 2.

The first gate dielectric 14 may be formed from any of several dielectric materials, including but not limited to thermally processed and thermally grown dielectric materials, as well as deposited dielectric materials. The first gate dielectric 14 may comprise conventional dielectric materials such as oxides, nitrides and oxynitrides of silicon that have a dielectric constant from about 4 to about 20, measured in vacuum. Alternatively, the first gate dielectric 14 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The first gate dielectric 14 may be formed using any of several methods that are appropriate to the material of composition of the first gate dielectric 14. Included, but not limiting are thermal or plasma oxidation or nitridation methods, chemical vapor deposition methods and physical vapor deposition methods. Typically, the first gate dielectric 14 comprises a higher dielectric constant dielectric material, such as a hafnium oxide dielectric material, that has a thickness from about 1 to about 5 nanometers. In addition, the first gate dielectric typically but not exclusively comprised of a hafnium oxide dielectric material may have an optional additional capping layer located thereupon. Such a capping layer may comprise, but is not necessarily limited to an aluminum oxide capping material that has a thickness from about 0.1 to about 0.3 nanometers.

The first gate electrode material layer 16 may comprise gate electrode materials including, but not limited to certain metals, metal alloys, metal nitrides and metal silicides, as well as laminates thereof and composites thereof. The first gate electrode material layer 16 may also comprise doped polysilicon and doped polysilicon-germanium alloy materials (i.e., having a dopant concentration from about 1e18 to about 1e22 dopant atoms per cubic centimeter) and polycide materials (doped polysilicon or polysilicon-germanium alloy/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the first gate electrode material layer 16 comprises a tantalum nitride material that may be either: (1) intrinsically deposited as a tantalum nitride material; or (2) deposited as a tantalum material and subsequently nitrided. Typically, the first gate electrode material layer 16 has a thickness from about 10 to about 40 nanometers.

The capping layer 18 may comprise any of several capping materials. Dielectric capping materials are most common, but by no means limit the embodiment or the invention. Such dielectric capping materials may include, but are not limited to oxides, nitrides and oxynitrides of silicon, but oxides, nitrides and oxynitrides of other elements are not excluded. The dielectric capping materials may be formed using any of the several methods that may be used for forming the isolation region 12. Typically, the capping layer 18 comprises a silicon oxide dielectric material that has a thickness from about 2 to about 5 nanometers.

The capping layer 18 may be optional within the embodiment and within the invention. When present, the capping layer 18 is intended as having hard mask properties for use in further processing of the semiconductor structure whose schematic cross-sectional diagram is illustrated in FIG. 2.

The photoresist layer 20 may comprise any of several photoresist materials. Suitable non-limiting examples include positive photoresist material, negative photoresist materials and hybrid photoresist materials that possess properties of positive photoresist materials and negative photoresist materials. Typically, the photoresist layer 20 comprises a positive photoresist material or a negative photoresist material that has a thickness from about 2,000 to about 10,000 angstroms.

Figure 3:
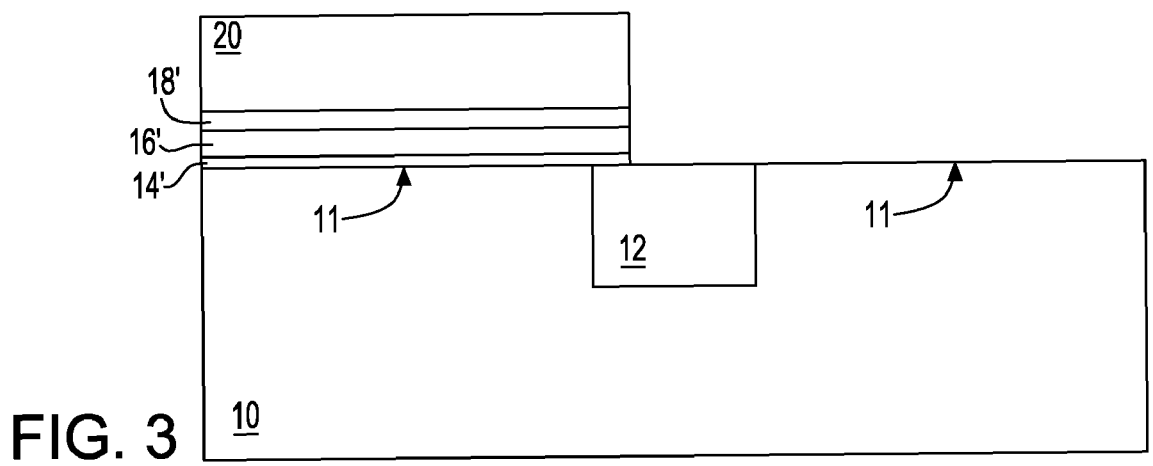

FIG. 3 shows the results of patterning the capping layer 18, the first gate electrode material layer 16 and the first gate dielectric 14 while using the photoresist layer 20 as a mask, to form a corresponding capping layer 18', first gate electrode material layer 16' and first gate dielectric 14'. The foregoing patterning that is effected while using the photoresist layer 20 as a mask, is also effected while using etch methods that are otherwise generally conventional in the semiconductor fabrication art. Such generally conventional etch methods may include, but are not limited to wet chemical etch methods and dry plasma etch methods. Dry plasma etch methods are under many circumstances generally preferred insofar as dry plasma etch methods generally provide straight sidewalls to many types of etched layers, although the presence of such straight sidewalls of etched layers is not a limiting feature of the capping layer 18', first gate electrode material layer 16' and first gate dielectric 14' that are illustrated in FIG. 3.

Figure 4:
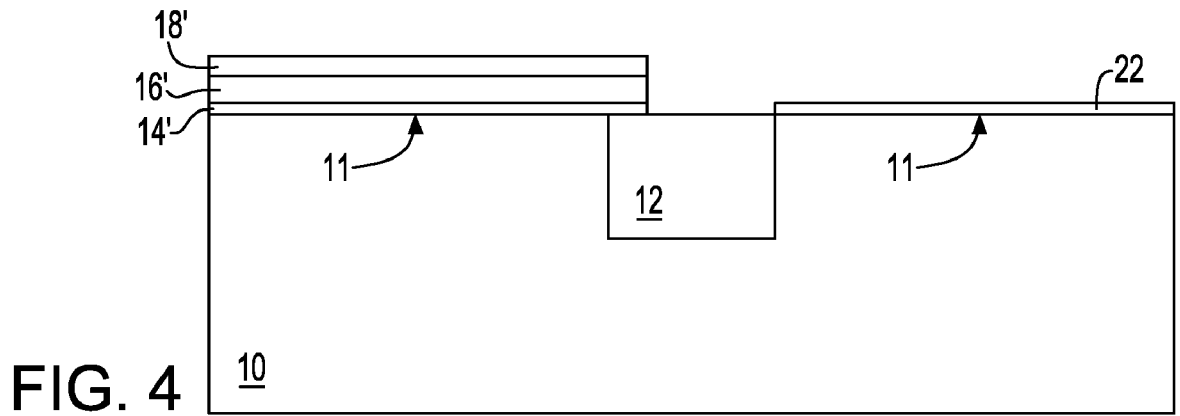

FIG. 4 first shows the results of stripping the photoresist layer 20 from the capping layer 18' within the semiconductor structure of FIG. 3. Optionally, the capping layer 18' may also be stripped from the first gate electrode material layer 16' at this point in time in processing of the semiconductor structure whose schematic cross-sectional diagram is illustrated in FIG. 3.

Each of the photoresist layer 20 and the capping layer 18' may be stripped using methods and materials that are otherwise generally conventional in the semiconductor fabrication art. Included in particular are wet chemical etch methods and dry plasma etch methods that may be used for stripping the photoresist layer 20 and the capping layer 18'. Particular components within the wet chemical etch methods and the dry plasma etch methods will typically differ for stripping a photoresist material that comprises the photoresist layer 20, in comparison with a capping material that comprises the capping layer 18'.

FIG. 4 further shows a second gate dielectric 22 located and formed upon the right hand active region 11 of the semiconductor substrate 10. Within the context of the instant embodiment and of the invention, the second gate dielectric 22 is formed using an area selective deposition method, such as in particular an area selective atomic layer deposition (ALD) method, or alternatively some other area selective deposition method that provides that the second gate dielectric 22 is located and formed aligned, and in particular self-aligned (i.e., in a plan-view aerial view) to the right hand active region 11 of the semiconductor substrate 10. Typically, an outer edge of the second gate dielectric 22 is aligned to an outer edge of the trench isolation region 12.

Certain types of area selective deposition methods are known in the semiconductor fabrication art. A particularly desirable area selective atomic layer deposition (ALD) method is taught within Chen et al., in "Achieving area-selective atomic layer deposition on patterned substrates by selective surface modification," Applied Physics Letters, 86, 191910-1 (2005). This particular area selective atomic layer deposition (ALD) method that is taught within Chen provides for passivation of a surface of an isolation region that surrounds an active region within a semiconductor substrate with an octadecyltrichlorosilane material to provide a deposition repellant surface to the isolation region, while simultaneously providing a hydrogenated surface (i.e., a hydrogenated silicon surface) within the active region of the semiconductor substrate. An otherwise generally conventional atomic layer deposition (ALD) method may then be used to deposit a dielectric material, such as but not limited to a hafnium oxide dielectric material, upon the active region of the semiconductor substrate that is not treated to be deposition repellant, such as the isolation region.

Although not in particular a limitation of the embodiment of the invention, the second gate dielectric 22 preferably comprises a hafnium containing dielectric material, such as but not limited to a hafnium oxide dielectric material or a hafnium silicate dielectric material, that is formed to a thickness from about 2 to about 5 nanometers.

Figure 5:
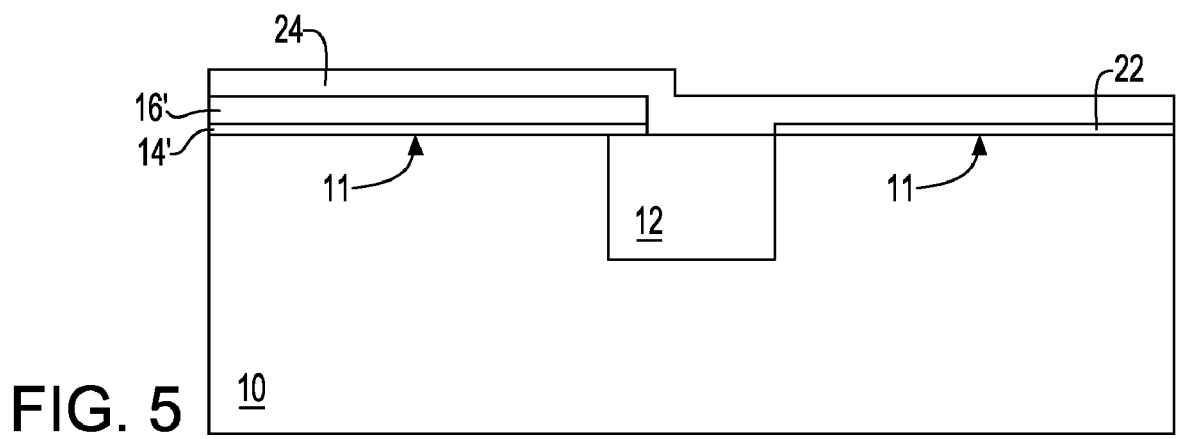

FIG. 5 first shows the results of stripping the capping layer 20' from the semiconductor structure of FIG. 4, if the capping layer 20' has not previously been stripped. FIG. 5 also shows a second gate electrode material layer 24 located and formed upon the resulting semiconductor structure, including in particular exposed portions of the first gate electrode material layer 16', the first gate dielectric 14', the isolation region 12 and the second gate dielectric 22.

The second gate electrode material layer 24 may comprise any of the several gate electrode materials from which may be comprised the first gate electrode material layer 16 that is illustrated in FIG. 2, and may also be formed using any of the several methods that are used for forming the first gate electrode material layer 16. However the first gate electrode material layer 16 and the second gate electrode material layer 24 are typically formed of different gate electrode materials. Within the context of the instant embodiment when the first gate electrode material layer 16 comprises a tantalum nitride gate electrode material, the second gate electrode material layer 24 typically comprises a tungsten nitride gate electrode material, although the particular foregoing materials selections do not limit the invention. Such a tungsten nitride gate electrode material may also be intrinsically deposited as a tungsten nitride material, or alternatively deposited as a tungsten material and subsequently nitrided, typically using a thermal nitridation method or a plasma nitridation method. Typically, the second gate electrode material layer 24, that comprises such a tungsten nitride material, has a thickness from about 10 to about 30 nanometers.

As is understood by a person skilled in the art, the use of different gate electrode materials in different locations within the semiconductor structure of FIG. 5, provides, upon further processing of the semiconductor structure that is illustrated in FIG. 5, for tuning of work functions in an nFET gate electrode and a pFET gate electrode within a CMOS structure that results from such further processing of the semiconductor structure whose schematic cross-sectional diagram is illustrated in FIG. 5.

Figure 6:
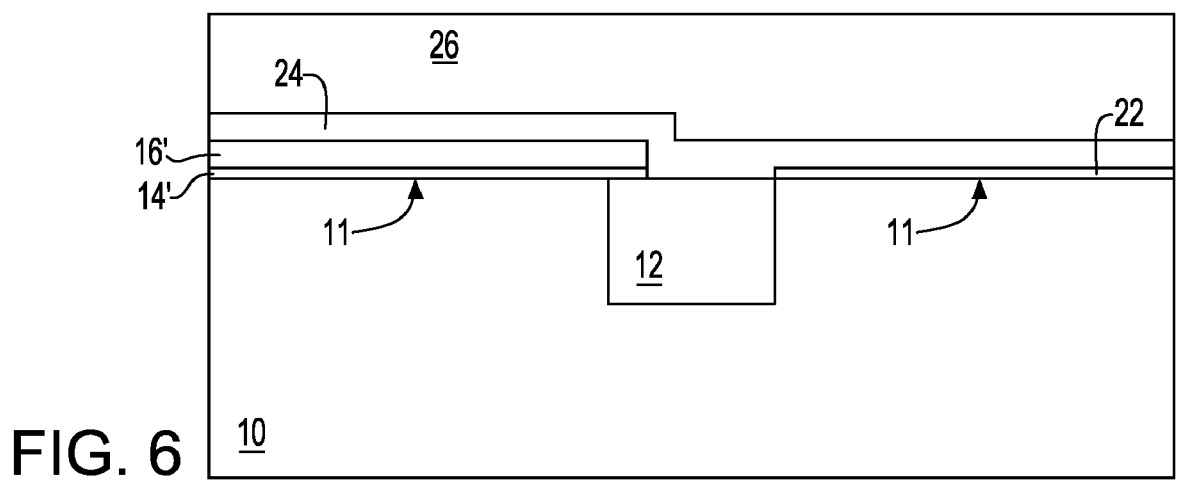

FIG. 6 shows a third gate electrode material layer 26 located and formed upon the second gate electrode material layer 24 that is illustrated in FIG. 5. Although the third gate electrode material layer 26 may in general comprise any of the several gate electrode materials from which may be comprised the second gate electrode material layer 24 and the first gate electrode material layer 16, the third gate electrode material layer 26 typically comprises a polysilicon gate electrode material. Again, the foregoing gate electrode materials selections do not limit the invention. Such a polysilicon gate electrode material is formed to a thickness from about 50 to about 100 nanometers.

Figure 7:
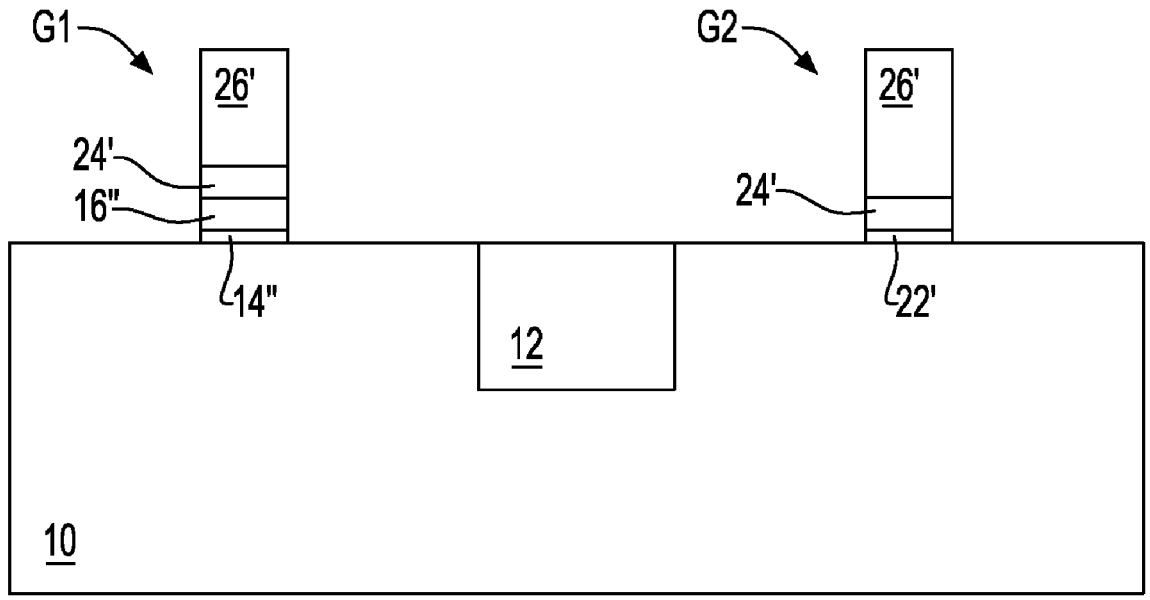

FIG. 7 shows the results of patterning the third gate electrode material layer 26, the second gate electrode material layer 24, the first gate electrode material layer 16', the second gate dielectric 22 and the first gate dielectric 14' to form a first gate stack G1 upon the left hand active region 11 of the semiconductor substrate 10 and a second gate stack G2 upon the right hand active region 11 of the semiconductor substrate 10. The first gate stack G1 comprises a first gate dielectric 14", a first gate electrode material layer 16" aligned upon the first gate dielectric 14", a second gate electrode material layer 24' aligned upon the first gate electrode material layer 16" and a third gate electrode material layer 26' aligned upon the second gate electrode material layer 24'. The second gate stack G2 comprises a second gate dielectric 22', a second gate electrode material layer 24' aligned upon the second gate dielectric 22' and a third gate electrode material layer 26' aligned upon the second gate electrode material layer 24'. The foregoing patterning may be effected using methods and materials that are otherwise generally conventional in the semiconductor fabrication art. Included in particular are wet chemical etch methods, dry plasma etch methods and combinations of wet chemical etch methods and dry plasma etch methods. Dry plasma etch methods are preferred to provide straight sidewalls to the first gate stack G1 and the second gate stack G2.

Figure 8A:
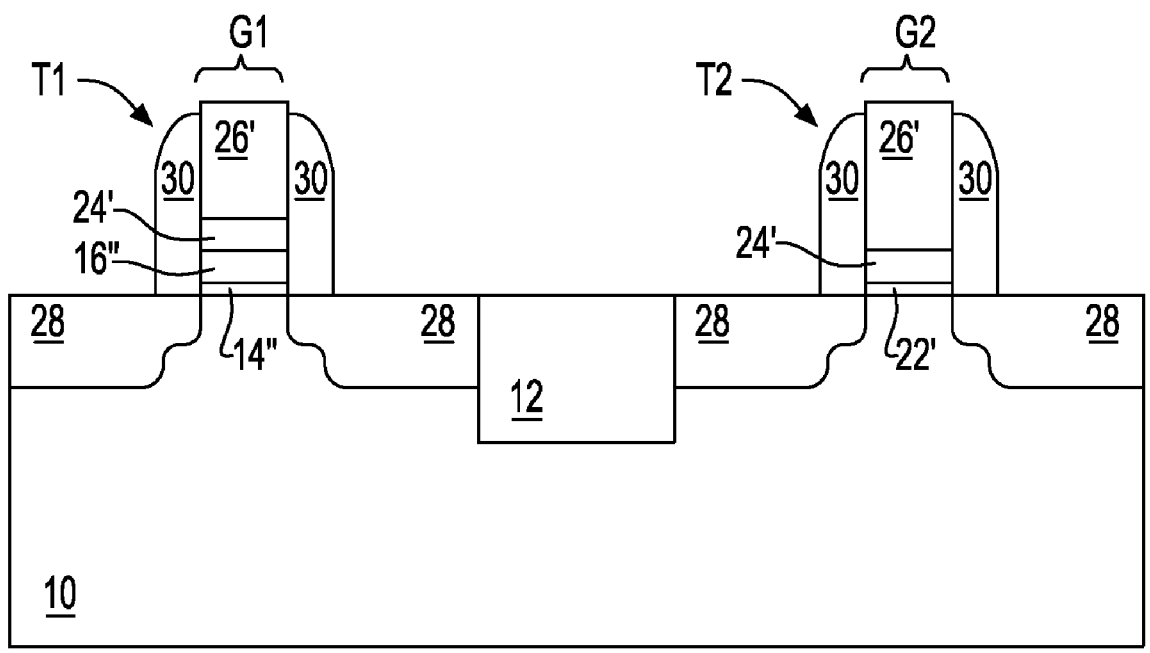

FIG. 8A first shows a plurality of spacers 30 locate adjacent and adjoining the first gate stack G1 and the second gate stack G2. The plurality of spacers 30 may comprise materials including but not limited to conductor materials and dielectric materials. Conductor spacer materials are less common, but are nonetheless known. Dielectric spacer materials are more common. The spacer materials may be formed using methods analogous, equivalent or identical to the methods that are used for forming the capping layer 20 that is illustrated in FIG. 2. The spacers 30 are also formed with the distinctive inward pointing spacer shape by using a blanket layer deposition and anisotropic etchback method. Typically, the spacers 30 comprise at least one of a silicon oxide spacer material and a silicon nitride spacer material.

FIG. 8A also shows a plurality of source and drain regions 28 located within the active regions 11 of the semiconductor substrate 10 and separated by the first gate stack G1 and the second gate stack G2. The source and drain regions 28 comprise a dopant of appropriate polarity and concentration for a particular nFET first transistor T1 or a particular pFEt second transistor T2 located and formed within their respective active regions 11 of the semiconductor substrate 10.

As is understood by a person skilled in the art, each of the source and drain regions 28 is formed using a two-step ion implantation method. A first ion implantation process step within the method uses a particular gate stack G1 or G2, absent the spacer 30 as a mask, to form a pair of extension regions each of which extends beneath the spacer 30. A second ion implantation process step uses the particular gate stack G1 or G2, and the spacer 30 as a mask, to form the larger contact region portions of the source and drain regions 30, while simultaneously incorporating the pair of extension regions. Dopant levels are from about 1e19 to about 1e21 dopant atoms per cubic centimeter within each of the source and drain regions 28. Extension regions within the source and drain regions 28 may under certain circumstances be more lightly doped than contact regions with the source and drain regions 30, although such differential doping concentrations are not a requirement of the embodiment or of the invention.

Figure 8B:
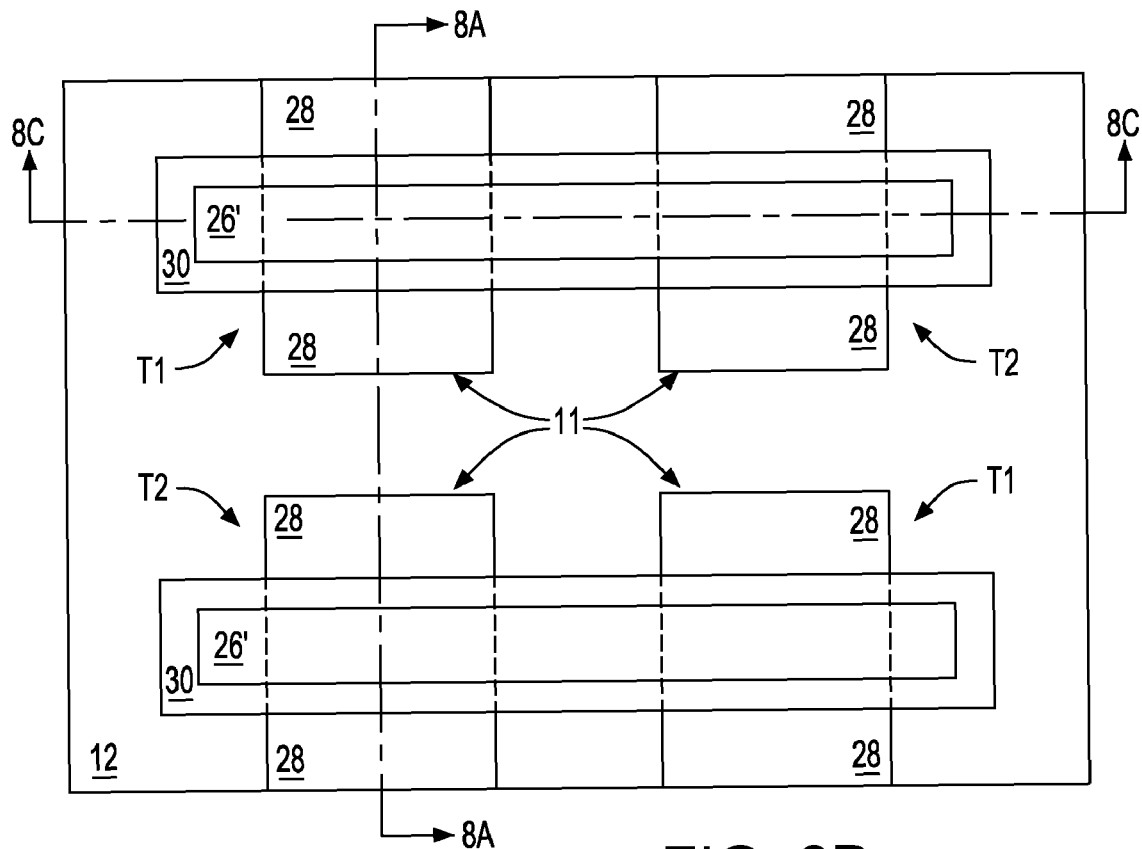

FIG. 8B shows a schematic plan-view diagram that corresponds with the schematic cross-sectional diagram of FIG. 8A. FIG. 8B shows the isolation region 12 that surrounds the active regions 11, exposed portions of which include the source and drain regions 28. The third gate electrode material layers 26', that are encircled by the spacers 30, each span a plurality of active regions 11 that include one each of a first transistor T1 and a second transistor T2.

Figure 8C:
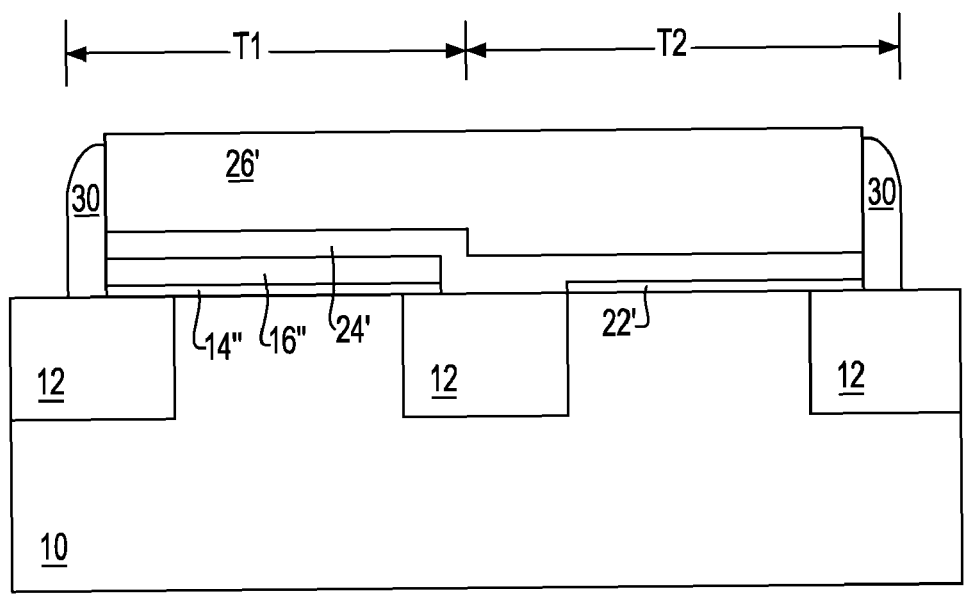

FIG. 8C shows an additional cross-sectional diagram that corresponds with the semiconductor structure whose schematic cross-sectional diagram is illustrated in FIG. 8A and whose schematic plan-view diagram is illustrated in FIG. 8B. FIG. 8C shows a schematic cross-sectional diagram in a direction over which a third gate electrode material layer 26' and a second gate electrode material layer 24' span two active regions 11, one of which is intended as including an nFET T1 and the other of which is intended as including a pFET T2.

As is illustrated within the schematic cross-sectional diagram of FIG. 8C, the second gate dielectric 22' is still located in-part aligned (i.e., after having been formed fully self-aligned and having a portion etched away when forming the gate stack G2) to the right hand active region 11 that is intended as including a pFET T2.

Figure 9:
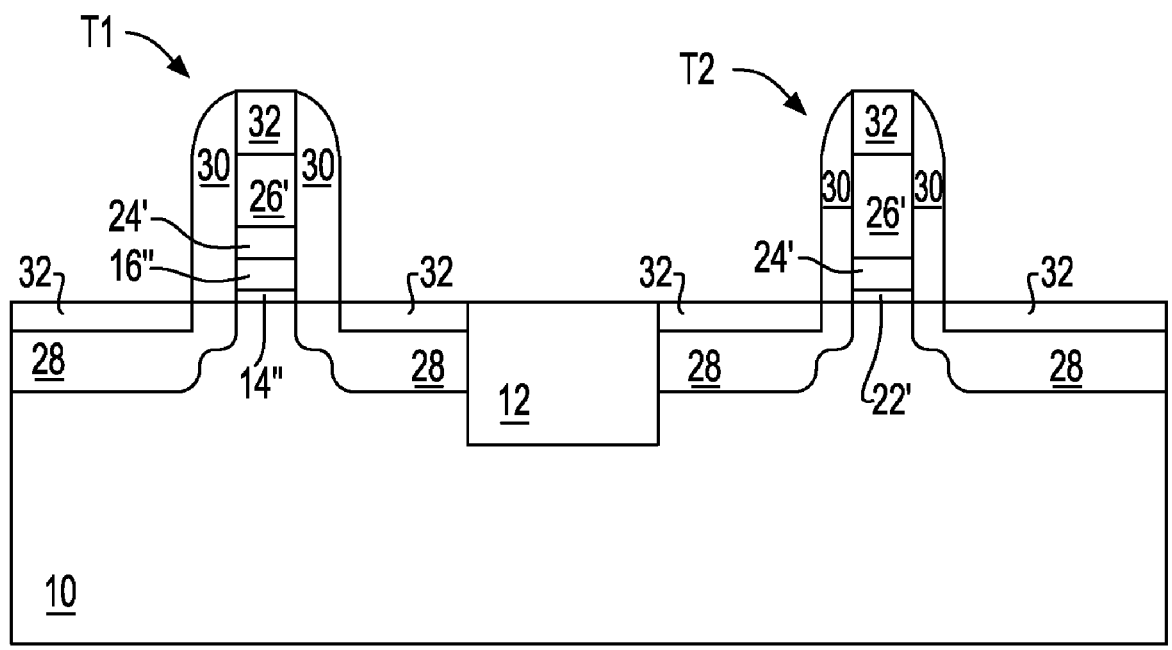

FIG. 9 shows a series of silicide layers 32 located and formed upon the source and drain regions 28 and the third gate electrode material layers 26' within the transistors T1 and T2. Although not in particular a limitation of the embodiment or of the invention, the silicide layers 32 are typically formed using a salicide method. Such a salicide method includes: (1) forming a blanket metal silicide forming metal layer upon the semiconductor structure of FIG. 8A; (2) thermally annealing the blanket metal silicide forming metal layer to form a metal silicide layer with silicon materials which it contacts; and (3) stripping excess unreacted portions of the blanket metal silicide forming metal layer to form from the semiconductor structure of FIG. 8A the semiconductor structure of FIG. 9. The blanket metal silicide forming metal layer may be formed using any of several metal silicide forming metals. Non-limiting examples include titanium, tantalum, tungsten, vanadium, cobalt and nickel silicide forming metals. Typically and preferably, the silicide layers 32 comprise a nickel silicide or a cobalt silicide that has a thickness from about 10 to about 50 nanometers.

FIG. 8A, FIG. 8B and FIG. 8C in particular show a series of schematic cross-sectional and plan-view diagrams illustrating a semiconductor structure in accordance with a preferred embodiment of the invention.

The semiconductor structure comprises a CMOS semiconductor structure that includes otherwise generally conventional field effect structures and layers, but wherein with respect to at least one transistor T2 within the CMOS structure a second gate dielectric 22' is located at least in-part aligned (and formed at least in-part self-aligned and more particularly fully self-aligned), with respect to an active region within which is formed the at least one transistor T2. While the preferred embodiment illustrates only one such second gate dielectric 22' within a CMOS structure as at least in part self-aligned, neither the embodiment, nor the invention, is so limited. Rather, within the context of the embodiment either one, or both, nFET active regions and pFET active regions of a semiconductor substrate may have located thereupon at least partially aligned, or alternatively fully aligned, an appropriate gate dielectric. Within the instant embodiment, the second gate dielectric 22' is located at least in-part self-aligned through use of an area selective deposition method, and in particular an area selective atomic layer deposition method.

The alignment, such as the self-alignment, of the second gate dielectric 22' within the CMOS structure whose schematic cross-sectional and plan-view diagrams are illustrated in FIG. 8A, FIG. 8B and FIG. 8C is desirable since such alignment and self-alignment provides for avoidance of a masking step that is otherwise needed for removing unneeded portions of a blanket second gate dielectric that may otherwise be used in place of the second gate dielectric 22'.

In addition, while the preferred embodiment thus illustrates the invention within the context of a CMOS structure, the embodiment is also not necessarily so limited, but may rather also be implemented within the context of singular semiconductor devices.

The preferred embodiment is illustrative of the invention rather than limiting of the invention. Revisions and modifications may be made to methods, materials, structures and dimensions of a CMOS structure in accordance with the preferred embodiment, while still providing a CMOS structure in accordance with the invention, further in accordance with the accompanying claims.

What is claimed is:

1. A semiconductor structure comprising:
   a semiconductor substrate including an isolation region that surrounds an active region;
   a gate dielectric comprising other than a thermal processing product of the semiconductor substrate located on a surface of the active region of the semiconductor substrate;
   a gate electrode located on a surface of said gate dielectric; and
   a pair of source and drain regions located within the active region and separated by a channel region located beneath the gate electrode, wherein said gate dielectric has a first set of edges in a first direction and a second set of edges in a second direction that intersects said first direction, wherein said first set of edges in said first direction is aligned to, and does not extend beyond, outer edges of said gate electrode, and said second set of edges in said second direction has a first edge that coincides with, and is aligned to, and does not extend beyond, a first edge of said isolation region in a view in a direction perpendicular to said surface of said active region and a second edge that extends beyond a second edge of said isolation region.

2. The semiconductor structure of claim 1 wherein the semiconductor structure comprises an nFET.

3. The semiconductor structure of claim 1 wherein the semiconductor structure comprises a pFET.

4. The semiconductor structure of claim 1 wherein the semiconductor substrate comprises a silicon semiconductor material.

5. The semiconductor structure of claim 1 wherein the gate dielectric comprises an oxide, nitride or oxynitride having a dielectric constant greater than about 20.

6. The semiconductor structure of claim 5 wherein the gate dielectric comprises a hafnium containing dielectric material.

7. The semiconductor structure of claim 1 wherein the semiconductor structure comprises a CMOS structure.

8. A CMOS semiconductor structure comprising:
   a semiconductor substrate including a plurality of active regions surrounded by an isolation region;
   a plurality of gate dielectrics located upon the plurality of active regions, at least one of the plurality of gate dielectrics comprising other than a thermal processing product of the semiconductor substrate;
   a plurality of gate electrodes located over the plurality of gate dielectrics; and a plurality of source and drain regions located within the plurality of active regions and separated by a plurality of channel regions located beneath the plurality of gate electrodes, wherein at least one of the plurality of gate dielectrics has a first set of edges in a first direction and a second set of edges in a second direction that intersects said first direction, said first set of edges in said first direction is aligned to, and does not extend beyond, outer edges of at least one of said plurality of gate electrodes, and said second set of edges in said second direction has a first edge that coincides with, and is aligned to, and does not extend beyond, a first edge of said isolation region in a view in a direction perpendicular to said surface of said active region and a second edge that extends beyond a second edge of said isolation region.

9. The CMOS structure of claim 8 wherein the at least one gate dielectric is fully aligned to the active region.

10. The CMOS structure of claim 8 wherein each of the plurality of gate dielectrics is at least partially aligned to an active region.

11. The CMOS structure of claim 8 wherein each of the plurality of gate dielectrics is fully aligned to an active region.

12. The CMOS structure of claim 8 wherein the semiconductor substrate comprises a silicon semiconductor material.

13. The CMOS structure of claim 8 wherein the gate dielectric comprises an oxide, nitride or oxynitride having a dielectric constant greater than about 20.

14. The CMOS structure of claim 13 wherein the gate dielectric comprises a hafnium containing dielectric material.

15. The semiconductor structure of claim 1 wherein said gate electrode comprises polysilicon.

16. The CMOS structure of claim 8 wherein the plurality of gate electrodes each includes polysilicon.

17. The semiconductor structure of claim 1 wherein said first edge of the isolation region is located on one end of the active region, and the second edge of the isolation region is located on another end of the active region.

* * * * *